(12) United States Patent
Topacio et al.

(10) Patent No.: US 8,058,108 B2
(45) Date of Patent: Nov. 15, 2011

(54) METHODS OF FORMING SEMICONDUCTOR CHIP UNDERFILL ANCHORS

(75) Inventors: Roden R. Topacio, Markham (CA); Neil McLellan, Toronto (CA)

(73) Assignee: ATI Technologies ULC, Markham (CA)

( * ) Notice: Subject to any disclaimer, the term of this patent is extended or adjusted under 35 U.S.C. 154(b) by 0 days.

(21) Appl. No.: 12/721,289

(22) Filed: Mar. 10, 2010

(65) Prior Publication Data
US 2011/0221065 A1 Sep. 15, 2011

(51) Int. Cl.
*H01L 21/00* (2006.01)

(52) U.S. Cl. ........ 438/127; 438/106; 438/637; 438/708; 257/E21.502; 257/E21.577

(58) Field of Classification Search .................... 438/709
See application file for complete search history.

(56) References Cited

U.S. PATENT DOCUMENTS

| | | | |
|---|---|---|---|
| 5,854,141 A | 12/1998 | Cronin et al. | |
| 6,022,791 A | 2/2000 | Cook et al. | |
| 6,049,124 A | 4/2000 | Raiser et al. | |
| 6,288,439 B1 * | 9/2001 | Bandou | 257/666 |
| 6,493,229 B2 | 12/2002 | Akram et al. | |
| 7,679,200 B2 | 3/2010 | Su et al. | |
| 2002/0043721 A1 | 4/2002 | Weber | |
| 2003/0171001 A1 | 9/2003 | Shinohara | |
| 2004/0026785 A1 | 2/2004 | Tomita | |
| 2004/0188136 A1 * | 9/2004 | Sunohara et al. | 174/255 |
| 2006/0180929 A1 | 8/2006 | Kroehnert et al. | |
| 2006/0278957 A1 | 12/2006 | Lin et al. | |
| 2007/0069336 A1 | 3/2007 | Ning | |
| 2007/0138635 A1 | 6/2007 | Ikumo et al. | |
| 2008/0073780 A1 | 3/2008 | Imori | |
| 2008/0083959 A1 | 4/2008 | Wu et al. | |
| 2008/0169555 A1 | 7/2008 | Topacio | |
| 2009/0032909 A1 | 2/2009 | Brofman et al. | |
| 2009/0166836 A1 * | 7/2009 | Kim et al. | 257/686 |
| 2009/0302427 A1 | 12/2009 | Su et al. | |
| 2010/0019381 A1 * | 1/2010 | Haeberlen et al. | 257/737 |

OTHER PUBLICATIONS

U.S. Appl. No. 12/388,064, filed Feb. 18, 2009, Michael Z. Su et al.
U.S. Appl. No. 12/388,092, filed Feb. 18, 2009, Michael Su et al.
USPTO Office Action mailed May 3, 2010; U.S. Appl. No. 12/388,092.
Guotao Wang et. al.; *Chip packaging interaction: a critical concern for Cu/low k packaging*; www.sciencedirect.com; Microelectronics Reliability 45 (2005) 1079-1093.
Marie-Claude Paquet et al.; *Underfill Selection Strategy for Pb-Free, Low-K and Fine Pitch Organic Flip Chip Applications*; 2006 Electronic Components and Technology Conference; 1-4244-0152-6/06/ $20.00 © 2006 IEEE; pp. 1595-1603.

(Continued)

*Primary Examiner* — Cheung Lee
(74) *Attorney, Agent, or Firm* — Timothy M. Honeycutt

(57) ABSTRACT

Various semiconductor chips and methods of making the same are disclosed. In one aspect, a method of manufacturing is provided that includes forming a first opening in an insulating layer applied to a side of a semiconductor chip. The first opening does not extend through to the side. A second opening is formed in the insulating layer that exposes a portion of the side.

10 Claims, 5 Drawing Sheets

OTHER PUBLICATIONS

John Baliga; *Yet Another Way to Use BCB*; Semiconductor International; http://www.semiconductor.net/article/CA6347341.html; Jul. 1, 2006; pp. 1-3.

PCT/US2010/024462 Partial International Search Report mailed Jun. 23, 2010.

PCT/US2010/024462 International Search Report mailed Dec. 14, 2010.

USPTO Notice of Allowance mailed Oct. 21, 2010; U.S. Appl. No. 12/388,092.

* cited by examiner

METHODS OF FORMING SEMICONDUCTOR CHIP UNDERFILL ANCHORS

BACKGROUND OF THE INVENTION

1. Field of the Invention

This invention relates generally to semiconductor processing, and more particularly to semiconductor chip underfill anchor structures and to methods of making the same.

2. Description of the Related Art

Flip-chip mounting schemes have been used for decades to mount semiconductor chips to circuit boards, such as semiconductor chip package substrates. In many conventional flip-chip variants, a plurality of solder joints are established between input/output (I/O) sites of a semiconductor chip and corresponding I/O sites of a circuit board. In one conventional process, a solder bump is metallurgically bonded to a given I/O site or pad of the semiconductor chip and a so-called pre-solder is metallurgically bonded to a corresponding I/O site of the circuit board. Thereafter the solder bump and the pre-solder are brought into proximity and subjected to a heating process that reflows one or both of the solder bump and the pre-solder to establish the requisite solder joint.

Flip-chip solder joints may be subjected to mechanical stresses from a variety of sources, such as coefficient of thermal expansion (CTE) mismatches, ductility differences and circuit board warping. Such stresses can subject the just described conventional solder joints to bending moments. The effect is somewhat directional in that the stresses tend to be greatest nearer the die edges and corners and fall off with increasing proximity to the die center.

To lessen the effects of CTE mismatch, underfill materials are routinely placed between a chip and the underlying package substrate, and more particularly between the chip and a solder resist layer on the package substrate. Like the solder joints, even the underfill may be subjected to bending moments. If severe enough or if the bonding of the underfill to the chip is locally weakened, delamination can occur. Underfill delamination can cause cracks to form in the solder joints and ultimately lead to device failure.

One conventional design utilizes a polyimide layer on the semiconductor chip to provide protection for various conductor structures positioned near the outermost surface of a semiconductor chip. Openings are formed in the polyimide layer to lead to the underlying metal structures. Additional openings are formed in the polyimide layer extending through to the semiconductor chip. These additional holes serve as anchor spots for underfill material to inhibit underfill delamination. However, the additional holes render the polyimide layer unsuitable as an etch mask.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes applying an insulating layer to a side of a semiconductor chip. A first opening is formed in the insulating layer that does not extend through to the side. A second opening is formed in the insulating layer that exposes a portion of the side.

In accordance with another aspect of an embodiment of the present invention, a method of manufacturing is provided that includes forming a first opening in a first insulating layer on a second insulating layer of a semiconductor chip. The first opening does not extend through to the second insulating layer. A second opening is formed in the first insulating layer that exposes a portion of the second insulating layer.

In accordance with another aspect of an embodiment of the present invention, an apparatus is provided that has a semiconductor chip that includes a side. A first insulating layer is on the side. A second insulating layer is on the first insulating layer and includes a first opening that does not extend through to the first insulating layer and a second opening that extends at least to the first insulating layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip are described herein. One example includes an outer insulating layer provided with one or more openings that do not extend through the entire depth of the insulating layer. The openings provide locations for underfill material projections to form mechanical linkages and inhibit underfill delamination. In addition, the insulating layer can serve as a mask against etch processes to remove material from beneath the insulating layer. Additional details will now be described.

Figure 1:
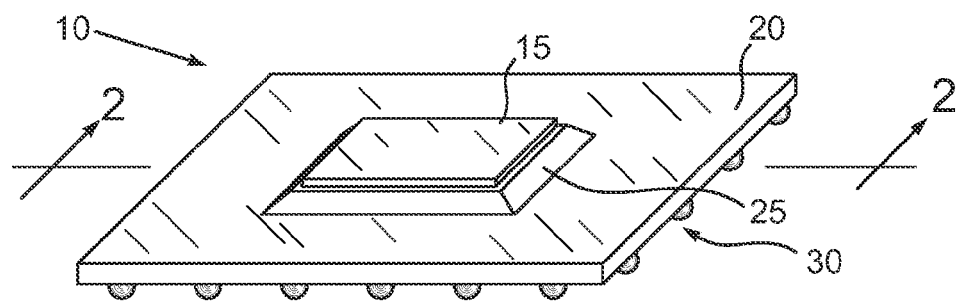
FIG. 1 is a pictorial view of an exemplary embodiment of a semiconductor chip device that includes a semiconductor chip flip-chip mounted on a circuit board.

In the drawings described below, reference numerals are generally repeated where identical elements appear in more than one figure. Turning now to the drawings, and in particular to FIG. 1, therein is shown a pictorial view of an exemplary embodiment of a semiconductor chip device (chip device) 10 that includes a semiconductor chip 15 flip-chip mounted on a circuit board 20. The chip device 10 includes an underfill material layer 25 to lessen the effects of CTE mismatch. To interface with other devices such as another circuit board, the circuit board 20 may be provided with a ball grid array labeled collectively 30, or some other interconnect system as described in more detail below.

The semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. The semiconductor chip 15 may be constructed of bulk semiconductor, such as silicon or germanium, or semiconductor-on-insulator materials, such as silicon-on-insulator materials.

The circuit board 20 may be a semiconductor chip package substrate, a circuit card, or virtually any other type of printed circuit board. Monolithic or laminate structures could be used. An exemplary laminate design will utilize a build-up process. In this regard, the circuit board 20 may consist of a central core upon which one or more build-up layers are formed and below which an additional one or more build-up layers are formed. The core itself may consist of a stack of one or more layers. One example of such an arrangement may include an arrangement where a single-layer core is laminated between two sets of two build-up layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. The circuit board 20 is provided with a number of conductor traces and vias and other structures (not visible) in order to provide power, ground and signals transfers between the semiconductor chip 15 and, for example, the circuit board 20.

Figure 2:
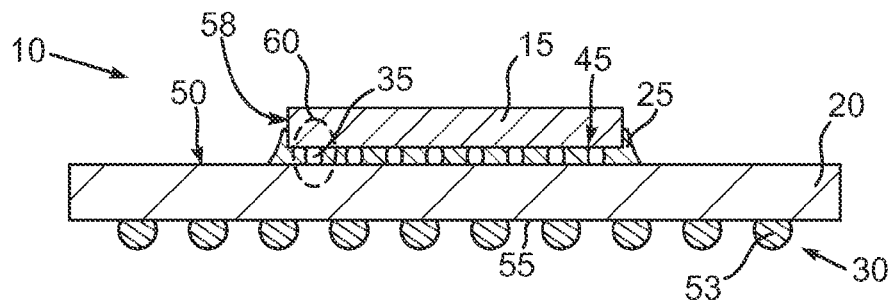
FIG. 2 is a sectional view of FIG. 1 taken at section 2-2.

Additional details of the chip device 10 may be understood by referring now to FIG. 2, which is a sectional view of FIG. 1 taken at section 2-2. The semiconductor chip 15 may be flip-chip mounted to the circuit board 20 and electrically connected thereto by plural solder joints 35 that are positioned between a side 45 of the semiconductor chip 15 and a side 50 of the circuit board 20. A portion of the underfill 25 is situated between the sides 45 and 50. Optionally, other types of interconnect structures such as conductive pillars or other types of structures may be used to interconnect the chip 15 to the circuit board 20. In this illustrative embodiment, the chip device 10 includes the partially encapsulating underfill material layer 25 that is designed to lessen the effects of differential CTE. Optionally, various types of coverings or heat spreaders may be used, such as lids composed of well-known plastics, ceramics or metallic materials as desired. Some exemplary materials include nickel plated copper, anodized aluminum, aluminum-silicon-carbide, aluminum nitride, boron nitride or the like. A resin or glob top design could also be used.

A few solder balls 53 of the ball grid array 30 are visible projecting from a side 55 of the circuit board 20. It should be understood that the solder balls 53 could number in the scores or hundreds depending on the complexity of the circuit board 20. Optionally, other types of interconnect systems, such as pin grid arrays, land grid arrays or others could be used. Of course, the side 55 could also be devoid of such interconnects. The solder balls 53 may be composed of various lead-based or lead-free solders. An exemplary lead-based solder may have a composition at or near eutectic proportions, such as about 63% Sn and 37% Pb. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. A typical reflow process may be performed at about 240 to 250° C. for about 8 to 15 seconds. The temperature and time will vary depending on the solder compositions and sizes, the geometry of the circuit board 20 and other variables.

A portion of FIG. 2 near an edge 58 of the semiconductor chip 15 is circumscribed by a dashed oval 60. The portion within the dashed oval 60 will be shown at greater magnification in FIG. 3 and used to describe additional features of the semiconductor chip 15. With that backdrop, attention is now turned to FIG. 3. Note that a small portion of the semiconductor chip 15 and the circuit board 20 are visible as well as the underfill material layer 25. The description that follows may be exemplary of other portions of the semiconductor chip 15 and the underfill 25. The solder joint 35 is electrically connected to a conductor pad 65 of the semiconductor chip 15 and a corresponding conductor pad 70 of the circuit board 20. If desired, a so-called underbump metallization structure could be interposed between the solder joint 35 and the pad 65. The solder joint 35 may be composed of the same types of solder materials as the solder balls 53 depicted in FIGS. 1 and 2. The solder joint 35 could be applied in two parts via paste, printing or the like and reflowed to establish metallurgical bonding. A suitable flux (not shown) could be applied to the pads 65 and 70 prior to reflow. The conductor pad 65 may be a part of a much more complicated interconnect layer that includes multiple conductor pads and traces. Two of the traces are shown and labeled 75 and 80 respectively. It should be understood that there may be huge numbers of such traces and pads depending upon the complexity of the semiconductor chip 15. There may also be similar types of traces and pads for the circuit board 20 which are not visible in FIG. 3. The conductor pads 65 and 70 and traces 75 and 80 may be composed of a variety of conductor materials, such as aluminum, copper, silver, gold, titanium, refractory metals, refractory metal compounds, alloys of these or the like. In lieu of a unitary structure, the pads 65 and 70 and traces 75 and 80 may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used. Various well-known techniques for applying metallic materials may be used, such as physical vapor deposition, chemical vapor deposition, plating or the like. It should be understood that additional conductor structures could be used.

The conductor pad 65 and the traces 75 and 80 and portions of the side 45 of the semiconductor chip 15 are covered by a passivation structure 85, which may be a monolithic insulating structure or a laminate as desired. In an exemplary embodiment, the passivation structure 85 may consist of alternating layers of silicon dioxide and silicon nitride. Note that the solder joint 35 projects down through an opening 72 in a solder mask 74 formed on the circuit board 20. The passivation structure 85 may be coated with an insulating layer 90 composed of polymers such as polyimide, benzocyclobutene or the like or other insulators. Thus the side 45 can be thought of as an outermost surface of the chip 15, which could be the chip 15 itself or a layer of material on the chip 15. An opening 95 is formed in the combination of the insulating layer 90 and the passivation structure 85 leading to the conductor pad 65. The solder joint 35 projects through the opening 95 to the pad 65.

The insulating layer 90 of the semiconductor chip 15 is provided with structure to inhibit the delamination of the underfill 25. More particularly, the insulating layer 90 is provided with plural openings, two of which are visible and labeled 100 and 105, respectively, so that projections 110 and 115 of the underfill 25 may interlock therewith. The projections 110 and 115 provide both a greater surface area for adhesive bonding between the underfill 25 and the insulating layer 90 and a mechanical linkage to inhibit the delamination of the underfill 25 from the insulating layer 90.

It should be understood that the number and configuration of the projections 100 and 115 may vary greatly. In this regard, attention is now turned to FIG. 4, which is a sectional view of FIG. 3 taken at section 4-4. Note that section 4-4 passes through the projections 100 and 115. In this illustrative embodiment, in addition to the projections 110 and 115, there are projections 120, 125, 130, 135, 140 and 150 that are positioned around the perimeter of the solder joint 35. Here, the projections 110, 115, 120, 125, 130, 135, 140 and 150 are symmetrically dispersed around the perimeter of the solder joint 35. However, it should be understood that asymmetric configurations may be used as well. Furthermore, while the illustrated projections 100, 110, 115, 120, 125, 130, 135, 140 and 150 have a generally circular cross section, it should be understood that a variety of different shapes may be used for some or all.

Figure 3:
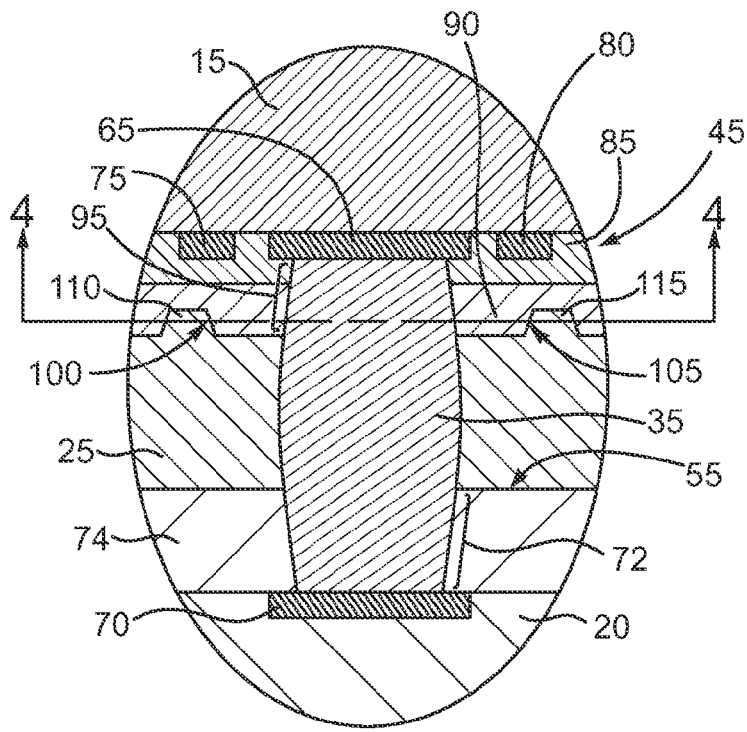
FIG. 3 is a portion of FIG. 2 shown at greater magnification.
Figure 4:
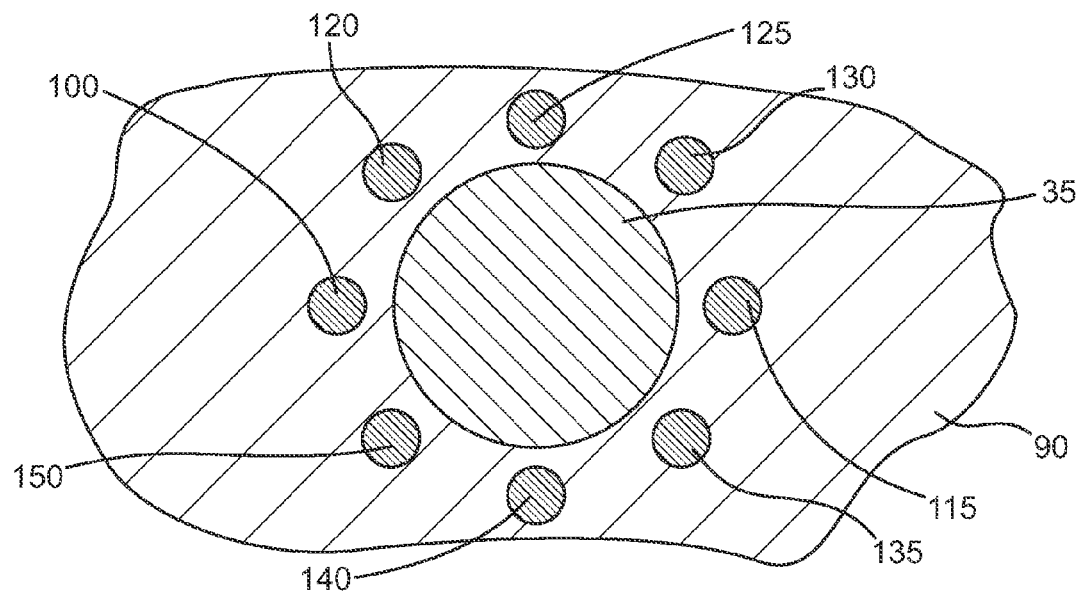
FIG. 4 is a sectional view of FIG. 3 taken at section 4-4.
Figure 5:
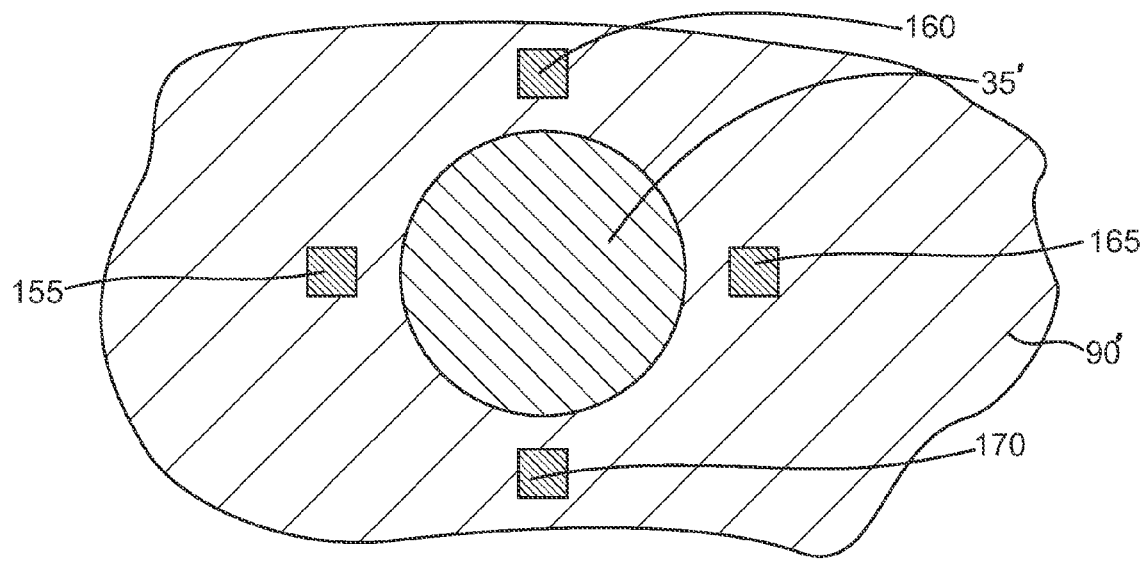
FIG. 5 is a sectional like FIG. 4, but of an alternate exemplary embodiment of a semiconductor chip device.

Attention is now turned to FIG. 5, which is a sectional view like FIG. 4, but of an alternate exemplary embodiment that illustrates four projections 155, 160, 165 and 170 arranged around the perimeter of a solder joint 35' and patterned with a generally square cross section. As with the embodiment depicted in FIGS. 1, 2, 3 and 4, a technical goal of providing the projections 155, 160, 165 and 170 is to inhibit the delamination from the insulating layer 90'.

Figure 6:
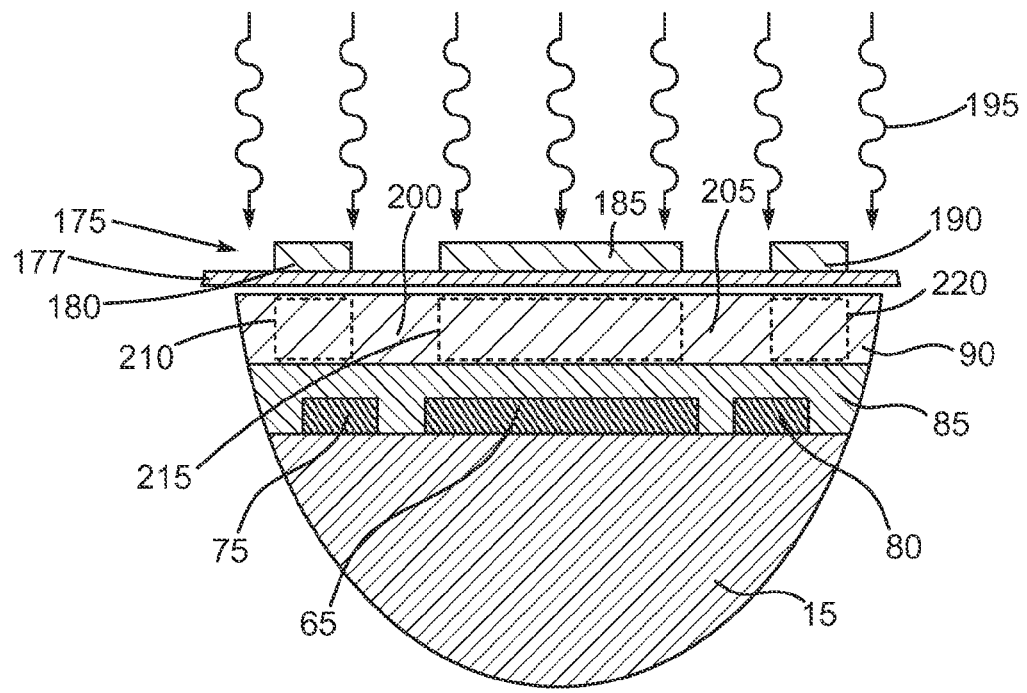
FIG. 6 is a sectional view depicting a small portion of an exemplary semiconductor chip undergoing a first photolithographic exposure.

An exemplary process for fabricating the semiconductor chip 15 with the underfill projections may be understood by referring now to FIGS. 6, 7, 8 and 9 and initially to FIG. 6. The process will be described in conjunction with the underfill projections 110 and 115 depicted in FIGS. 3 and 4 but will be illustrative of the projections of the underfill 25 depicted in those figures as well. It should be understood that the processes described herein that are performed on the semiconductor chip 15 may be performed on a discrete chip or en masse on several circuit chips of a wafer or other workpiece. FIG. 6 is a sectional view like FIG. 3 but with a few notable exceptions. Here, the same small portion of the semiconductor chip 15 that is represented by the oval shape in FIG. 3 is used. However, the semiconductor chip is flipped over from the orientation depicted in FIG. 3. Thus, the semiconductor chip 15 appears below the conductor pad 65 and the traces 75 and 80 as well as the passivation structure 85 and the insulating layer 90. In order for the underfill material 25 to establish the projections 110 and 115 in the insulating layer 90, it is necessary to form openings in the insulating layer 90. The formation of the openings may be accomplished in a number of ways.

In this illustrative embodiment, the insulating layer 90 may be composed of polyimide, benzocyclobutene, or the like with photoactive compounds so that photolithography may be used to establish the requisite openings. Assume for the purposes of this illustration that the insulating layer 90 includes negative tone photoactive compounds. At this stage, a non-contact photomask 175 may be placed over the insulating layer 90. The non-contact mask 175 includes a transparent substrate 177 and opaque portions 180, 185 and 190 that are designed to block out exposure radiation 195 and are provided with shapes that correspond to the desired footprints of the layer formed openings in the insulating layer 90. Chrome or the like may be used for the opaque portion 174 and some sort of glass or other suitable material for the substrate 177. Optionally, a photolithography mask may be formed on the insulating layer 90 and patterned lithographically by well-known techniques. Thereafter, an exposure process is performed in order to expose the unmasked portions of the insulating layer 90 and render them insoluble in a subsequent developing solution. Following the exposure, the mask 175 may be removed, or stripped by ashing, solvent stripping or the like if formed of resist. Suitable exposure parameters will depend on the characteristics of the insulating layer 90, such as thickness and composition. In an exemplary embodiment where the insulating layer 90 is about 10 to 20 μm thick and composed of polyimide, broadband light at about 130 mjoules/cm$^3$ for about 5 to 10 seconds may be used. The exposure light cures and renders the exposed portions, such as the portions 200 and 205 insoluble in a developer solution.

Figure 7:
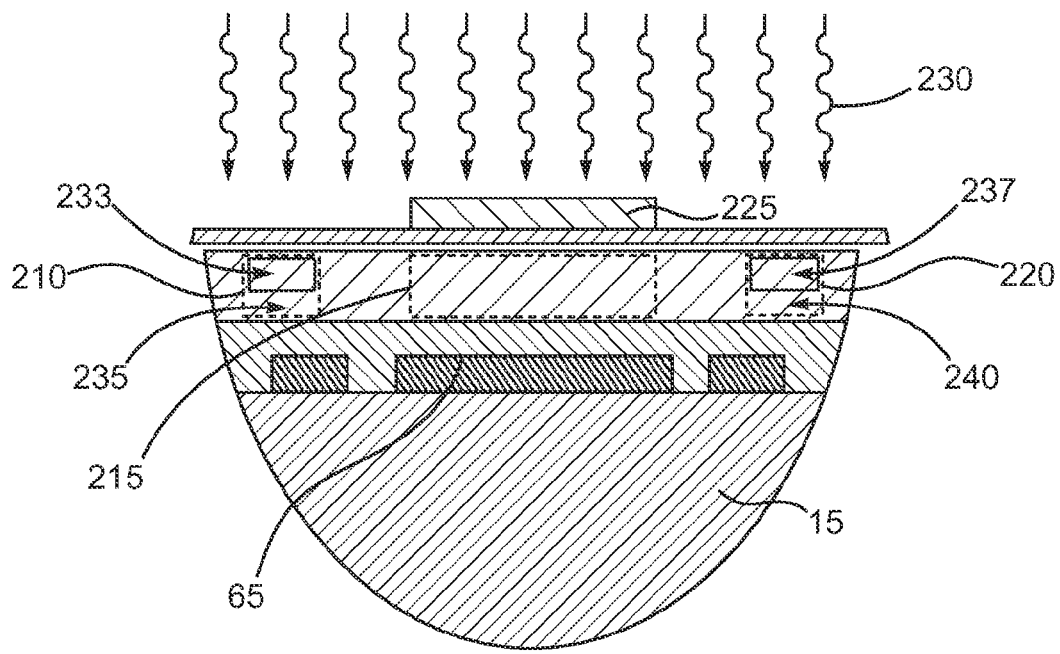
FIG. 7 is a sectional view like FIG. 6 depicting a small portion of an exemplary semiconductor chip undergoing a second photolithographic exposure.

Following the exposure, unexposed portions represented schematically by the dashed boxes 210, 215 and 220 remain in the insulating layer 90. The unexposed portions 210, 215 and 220 remain fully soluble in a developer solution. If the non-contact mask 175 is removed and the insulating layer 90 is developed in an appropriate developer solution at this point, then openings would be formed at the locations of the dashed boxes 210, 215 and 220 that extend all the way to the passivation structure 85. While full depth dissolution remains a technical goal for the portion of the insulating layer 90 in the vicinity of the dashed box 215 since the underlying pad 65 must be exposed to facilitate solder connection, such is not the case for portions of the insulating layer 90 exemplified by the dashed boxes 210 and 220. Accordingly, and as depicted in FIG. 7, a second exposure is performed with a second non-contact mask 225 that shields the unexposed portion 215 aligned with the conductor pad 65 but does not shield the areas where the unexposed portions 210 and 220 are located. Instead, the dosage of exposure radiation 230 is dropped low enough so that the previously fully unexposed portion 210 is bifurcated into a partially light cured upper portion 232 and an unexposed and uncured region 235. The partially light cured portion 232 has become only semi-resistant to dissolution in an appropriate developer solution. The previously unexposed portion 220 is similarly bifurcated into a partially light cured portion 237 and a unexposed and uncured region 240. A technical goal is to slow dramatically the disillusion rate of the insulating layer 90 in the vicinity of the partially cured portions 233 and 237 so that they dissolve but not completely to the passivation structure 85. The second exposure may be performed using the same general parameters but with a dosage of about 65 mjoules/cm$^3$.

Figure 8:
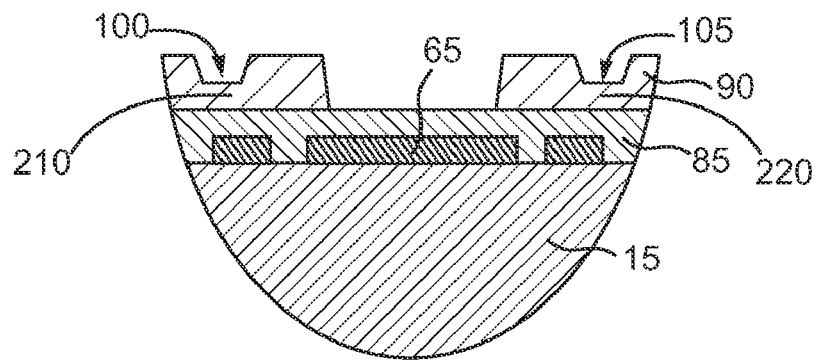
FIG. 8 is a sectional view like FIG. 7 depicting photolithographic development.

Referring now to FIG. 8, the non-contact mask 225 depicted in FIG. 7 is removed and the insulating layer 90 is subjected to an appropriate developer solution to establish the openings 100 and 105. Because the regions 210 and 220 have not received sufficient radiation to switch solubility, the developing process does not cause the openings 100 and 105 to project all the way to the passivation structure 85. However, the developing process does completely penetrate to the passivation structure 85 proximate the conductor pad 65 since that region remained unexposed. A variety of developers may be used. In an exemplary embodiment, a mixture of about 48% cylohexane, about 60% cylopentane and about 1% methanol may be used.

Figure 9:
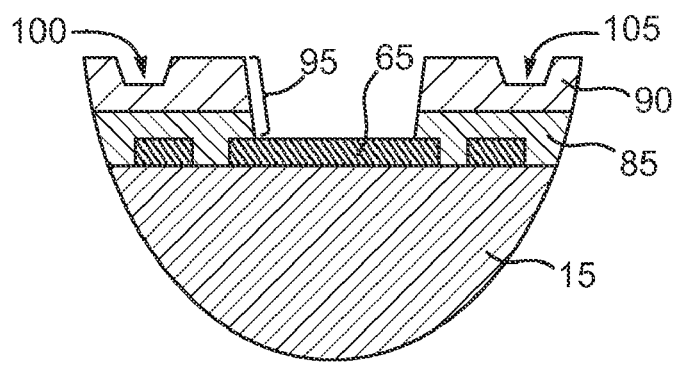
FIG. 9 is a sectional view like FIG. 8 depicting an etch process.

Next and as depicted in FIG. 9, the passivation structure 85 may be subjected to an etch process to expose a portion of a conductor pad 65 and thus yield the completed opening 95 in the laminate of the passivation structure 85 and the insulating layer 90. A variety of well-known etch techniques may be used, such as plasma etching, wet etching, laser drilling or other material removal techniques. The insulating layer 90 serves as an etch mask. In this way, a separate masking process is not necessary to etch the passivation structure 85 and the insulating layer 90 is still provided with useful openings 100 and 105 to ultimately yield underfill anchoring.

Referring again also to FIG. 3, the semiconductor chip 15 may be mounted to the circuit board 20 by flip-chip mounting techniques and thereafter the underfill material layer 25 may be inserted between the semiconductor chip 15 and the circuit board 20 by well-known techniques. The underfill material 25 will by capillary action or otherwise fill the openings 100 and 105 to establish the projections 110 and 115 depicted in FIG. 3.

Figure 10:
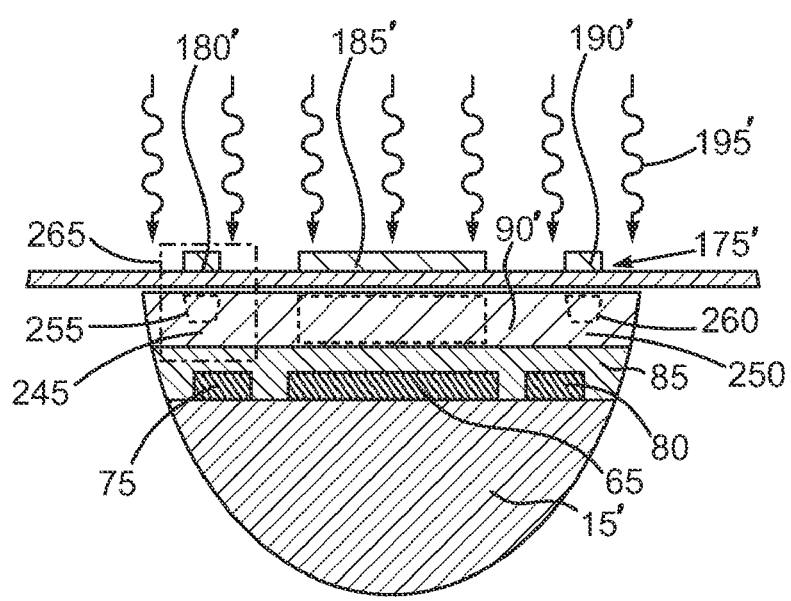
FIG. 10 is a sectional view like FIG. 6, but depicting a small portion of an alternate exemplary semiconductor chip undergoing an alternate exemplary photolithographic exposure.
Figure 11:
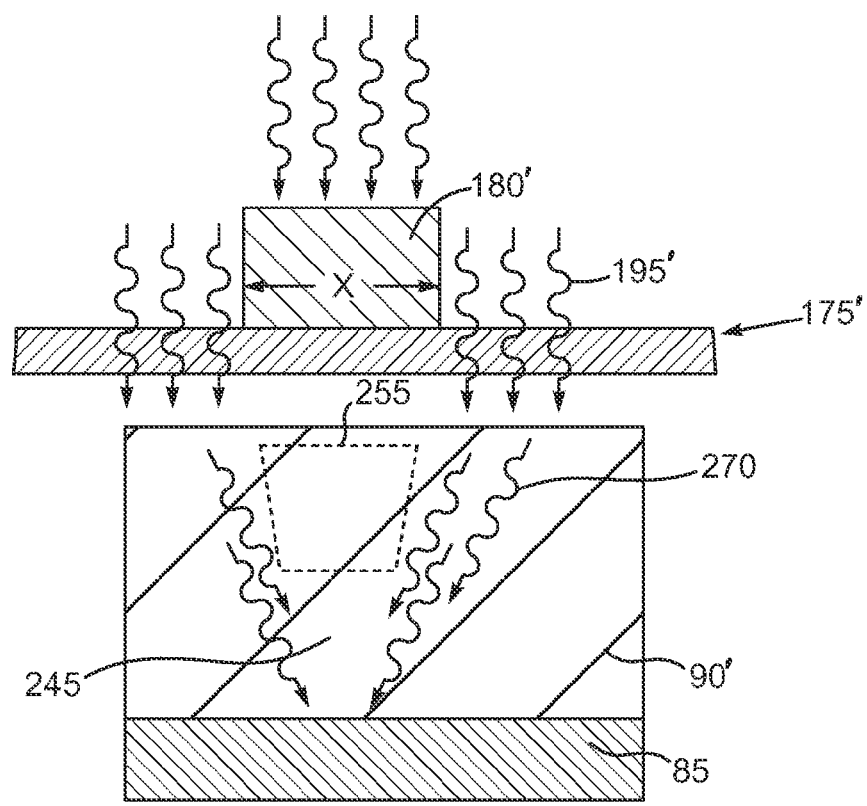
FIG. 11 is a portion of FIG. 10 shown at greater magnification.

Alternative methods may be used to establish openings in an insulating layer on a semiconductor chip in order to facilitate the subsequent establishment of underfill material layer projections. In this regard, attention is now turned to FIG. 10, which is a sectional view like FIG. 6, but of an alternate exemplary embodiment of a semiconductor chip 15'. Here, the semiconductor chip 15' may be similarly provided with a conductor pad 65 and traces 75 and 80 and a passivation structure 85. An insulating layer 90' may be established on the passivation structure 85 as described elsewhere herein. A non-contact mask 175' that includes portions 180', 185' and 190' may be positioned over the insulating layer 90' as generally described elsewhere herein. As with the other disclosed exemplary embodiments, a goal is to establish an opening in the insulating layer 90' leading to the passivation structure 85 proximate the conductor pad 65, but much shallower openings to either side of the conductor pad 65 that do not extend to the passivation structure 85. In this illustrative embodiment, the portions 180' and 190' of the non-contact mask 175' are sized with a lateral dimension that is sufficiently small so that when the exposure radiation 195' passes through the mask 175' and enters the insulating layer 90', scattering effects cause the regions 245 and 250 of the insulating layer 90' closest to the passivation structure 85 to become exposed and light cured, and thus insoluble in a developer. However, shallow unexposed portions 255 and 260 remain. The effect is illustrated further in FIG. 11, which is the portion of FIG. 10 circumscribed by the dot/dash box 265 shown at greater magnification. As the exposure radiation 195' enters the insulating layer 90' around the perimeter of the opaque portion 180' of the non-contact mask 175', scattering effects cause the light rays 270 to converge at some depth into the insulating layer 90' and thus render the region 245 exposed and insoluble in a developer. However, as noted above, a volume or portion represented by the trapezoid shaped box 255 remains unexposed and thus soluble in a developer. The non-contact portion 180' may be provided with some lateral dimension X that is small enough to ensure that the portion 245 of the insulating layer 90 receives enough exposure to be rendered insoluble in a developer. The appropriate size of the dimension X may be determined empirically. Of course the dimension X may be a diameter or other dimension depending upon the footprint of the mask portion 180'. The non-contact mask, i.e., the portion 180' and the other portions thereof may be removed and the insulating layer 90' subjected to a developing process to form an opening therein. Here, the region 255 will be soluble in the developer and thus create an opening that does not extend to the underlying passivation structure 85.

The processes have been described herein in the context of negative tone lithography. However, positive tone could be used. Furthermore, material removal techniques could be used in lieu of photolithography. It should also be understood that the openings for accommodating underfill projections could be made in whatever constitutes a side of a semiconductor chip.

The skilled artisan will appreciate that the placement of reinforcing underfill projections need not be tied to solder joint or other interconnect structure location. In this regard, attention is now turned to FIG. 12, which is a sectional view like FIG. 4, but at a lower magnification. Due to the lower magnification, the edge 58 of the insulating layer 90 and a larger portion of the underfill 25 are visible. For simplicity of illustration only the solder joint 35 and underfill projections 100, 115 and 125 also shown in FIG. 4 are labeled. Additional underfill projections collectively labeled 275 may be formed in the insulating layer 90 as described elsewhere herein. The underfill projections 275 may be placed anywhere underfill material interfaces with the insulating layer 90 or semiconductor chip 15 at large if there is no insulating layer 90. In this illustration, the underfill projections 275 track a perimeter 280 of the solder mask 90.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a first opening in an insulating layer applied to a side of a semiconductor chip, the first opening not extending through to the side, the insulating layer including a photoactive compound;
   forming a second opening in the insulating layer that exposes a portion of the side; and
   wherein the first and second openings are formed by photolithographic patterning that includes masking first and second portions of the insulating layer, exposing the insulating layer with a first light dosage to leave the first and second portions uncured, masking the second portion but not the first portion of the insulating layer, exposing the first portion of the insulating layer with a second light dosage smaller than the first light dosage to leave a region of the first portion proximate the side uncured, and developing the insulating layer to form the first and second openings.

2. The method of claim 1, comprising placing an underfill on the insulating layer so that a portion thereof projects into the first opening.

3. The method of claim 1, comprising coupling the semiconductor chip to a circuit board.

4. The method of claim 3, wherein the circuit board comprises a semiconductor chip package substrate.

5. The method of claim 1, wherein the insulating layer comprises polyimide.

6. A method of manufacturing, comprising:
   forming a first opening in an insulating layer applied to a side of a semiconductor chip, the first opening not extending through to the side, the insulating layer including a photoactive compound;

forming a second opening in the insulating layer that exposes a portion of the side; and wherein the first and second openings are formed by photolithographic patterning that includes masking first and second portions of the insulating layer with a mask comprising a first opaque structure having a first lateral dimension and a second opaque structure having a second lateral dimension, exposing the insulating layer with light to cure the second portion, wherein the first lateral dimension is selected to enable the light to interact inside the insulating layer to leave a region of the first portion proximate the side uncured, and developing the insulating layer to form the first and second openings.

7. The method of claim 6, comprising placing an underfill on the insulating layer so that a portion thereof projects into the first opening.

8. The method of claim 6, comprising coupling the semiconductor chip to a circuit board.

9. The method of claim 8, wherein the circuit board comprises a semiconductor chip package substrate.

10. The method of claim 6, wherein the insulating layer comprises polyimide.

* * * * *

UNITED STATES PATENT AND TRADEMARK OFFICE
CERTIFICATE OF CORRECTION

PATENT NO. : 8,058,108 B2
APPLICATION NO. : 12/721289
DATED : November 15, 2011
INVENTOR(S) : Roden R. Topacio et al.

Page 1 of 1

Figure 12:
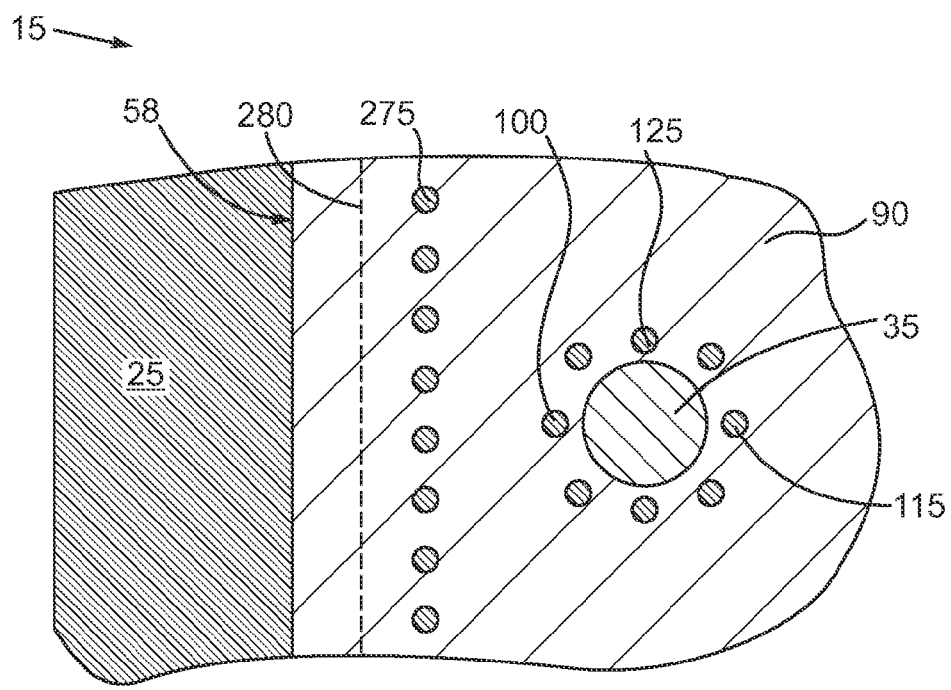
FIG. 12 is a sectional view like FIG. 4, but depicted at lesser magnification.

It is certified that error appears in the above-identified patent and that said Letters Patent is hereby corrected as shown below:

In the drawings, Sheet 2, FIG. 4 and Sheet 5, FIG. 12, each occurrence of reference numeral "100" should read --110--;

In the Specification

In column 5, lines 8 and 11, each occurrence of "100" should read --110--; and

In column 5, line 19, delete "100".

Signed and Sealed this
Thirtieth Day of July, 2013

Teresa Stanek Rea
*Acting Director of the United States Patent and Trademark Office*